United States Patent [19]

Nam

[11] Patent Number: 5,801,409
[45] Date of Patent: Sep. 1, 1998

[54] MULTIPHASE CHARGE COUPLED DEVICE SOLID-STATE IMAGE SENSORS

[75] Inventor: Jung-hyun Nam, Kyungki-do, Rep. of Korea

[73] Assignee: Samsung Electronics Co., Ltd., Suwon, Rep. of Korea

[21] Appl. No.: 768,802

[22] Filed: Dec. 18, 1996

[30] Foreign Application Priority Data

Dec. 30, 1995 [KR] Rep. of Korea ............... 1995 69744

[51] Int. Cl.$^6$ ............................................. H01L 27/148
[52] U.S. Cl. ............................................. 257/233; 257/231
[58] Field of Search ............................ 257/233, 231, 257/232, 226, 242, 234

[56] References Cited

U.S. PATENT DOCUMENTS

| | | |
|---|---|---|
| 4,581,539 | 4/1986 | Kimura ........................... 257/232 |
| 4,689,687 | 8/1987 | Koike et al. ..................... 257/232 |
| 4,810,901 | 3/1989 | Yamada ........................... 257/232 |
| 5,326,997 | 7/1994 | Nakanishi ........................ 257/230 |
| 5,434,437 | 7/1995 | Itakura et al. ................... 257/232 |
| 5,528,291 | 6/1996 | Oda ................................. 348/220 |

*Primary Examiner*—David B. Hardy
*Attorney, Agent, or Firm*—Myers Bigel Sibley & Sajovec

[57] ABSTRACT

Charge coupled device (CCD) solid-state image sensors comprise a substrate including a plurality of sensor groups. Each sensor group consists of N photodiodes and 2N+1 transfer electrodes, where N is at least two. By providing, for example, two photodiodes and five transfer electrodes in a group, improved area efficiency may be provided along with efficient manufacturing and driving. Three insulated patterned conductive layers are formed on a gate insulating layer, to define the first through fifth transfer electrodes on the transfer region.

14 Claims, 10 Drawing Sheets

MULTIPHASE CHARGE COUPLED DEVICE SOLID-STATE IMAGE SENSORS

FIELD OF THE INVENTION

The present invention relates to semiconductor devices and methods for manufacturing and operating the same, and more particularly, to charge coupled device (CCD) solid-state image sensors, and methods for fabricating and driving the same.

BACKGROUND OF THE INVENTION

Charge coupled device (CCD) solid-state image sensors are widely used in home or broadcast video camera systems and supervisory camera systems. CCD sensors can be small and light, and can consume less power than a camera system using an electron gun.

For example, interline transfer-charge coupled device (IT-CDD) solid state image sensors convert picture information to voltage information. In IT-CCD sensors, light which is incident on a two dimensional photodiode array in a semiconductor substrate is converted into light-excited charge and accumulated. The accumulated charge in the photodiode is moved to vertical charge transfer means, such as a vertical CCD (V-CCD), through a transmission channel (CH) and transferred in a vertical direction. The charge is moved to horizontal transferring means, such as a horizontal CCD (H-CCD) formed at the end of the V-CCD. The charge is transferred in a horizontal direction, and the transmitted charge is sequentially transferred to an output circuit and converted to a voltage. It will be understood that the terms "horizontal" and "vertical" are used to refer to two relative orthogonal orientations, rather than to absolute directions.

The conventional CCD type solid-state image sensor for a video camera generates an interlaced video signal for transferring one frame to two odd and even fields in accordance with standard TV requirements. Thus, conventional CCD sensors vertically add the charges by matching one stage of a vertical CCD to two vertically consecutive photodiodes, and transfer the same, and interlace the combination of the photodiodes in odd and even fields. In this case, since the V-CCD is generally a four-phase type, two CCD gate electrodes are generally matched with one photodiode. Therefore, it is possible to form a CCD by a two-layer polysilicon process.

Solid-state image sensors are now being used for computer multimedia presentations. For computer display applications, signals of the respective photodiodes should be maintained separately without adding the signals so as to correspond to a personal computer screen having no interlaced scanning. Such an output pattern is called a full pixel read-out mode, which may be difficult to produce due to the complexity of processing. For example, when a four-phase CCD is used, since four gate electrodes may be required for one photodiode, a four-layer polysilicon process may be necessary.

Figure 1:
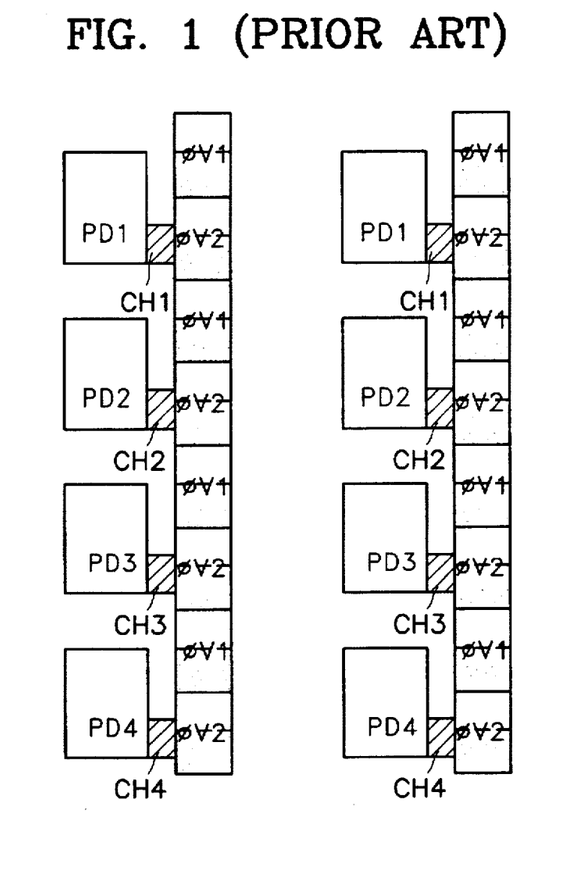
FIG. 1 is a plan view showing a pixel arrangement of a full pixel read-out mode IT-CCD type solid-state image sensor according to a conventional method in which a two phase CCD is used as vertical charge transfer means.

FIG. 1 is a plan view showing a pixel arrangement of a conventional full pixel read-out mode IT-CCD type solid-state image sensor using a two-phase CCD as vertical charge transfer means. Two gate electrodes of the V-CCD, i.e. first and second gate electrodes ($\phi$V1 and $\phi$V2), are arranged in every unit photodiode PD1, PD2, PD3, and PD4. The photodiodes PD1, PD2, PD3 and PD4 are arranged to be adjacent one another in a vertical direction and the gate electrodes of the vertical CCD are also arranged in the vertical direction to correspond thereto. The transfer region of the V-CCD (the region for vertically transferring the charge transmitted from the photodiode, which is overlapped with the first and second gate electrodes) is formed in the semiconductor substrate beneath the gate electrodes $\phi$V1 and $\phi$V2. A potential barrier region (the dotted region in FIG. 1) corresponding in size to ½ each gate electrode is also formed in the semiconductor substrate beneath the respective electrodes.

The charge accumulated in a photodiode is transferred to the transfer region of the V-CCD through the transmission channel (CH) and is transferred in a vertical direction, i.e. the arrangement direction of the photodiodes, by a clock pulse applied to the gate electrodes $\phi$V1 and $\phi$V2 of the V-CCD.

Figure 2:
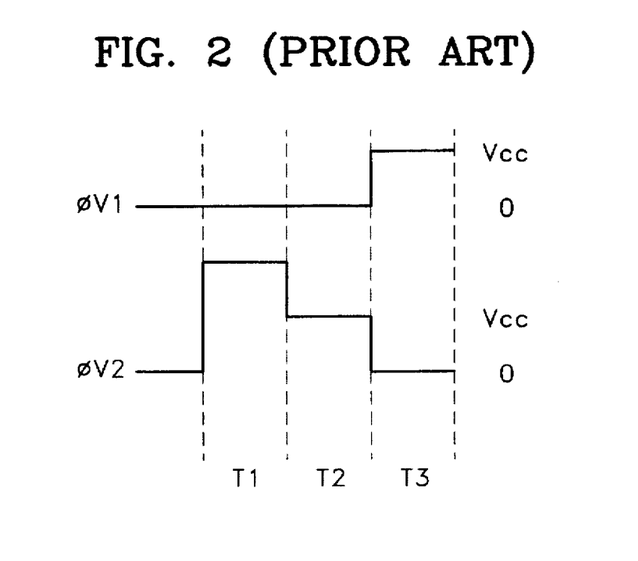
FIG. 2 is a waveform view of a clock pulse applied to the IT-CCD type solid-state image sensor shown in FIG. 1.
Figure 3:
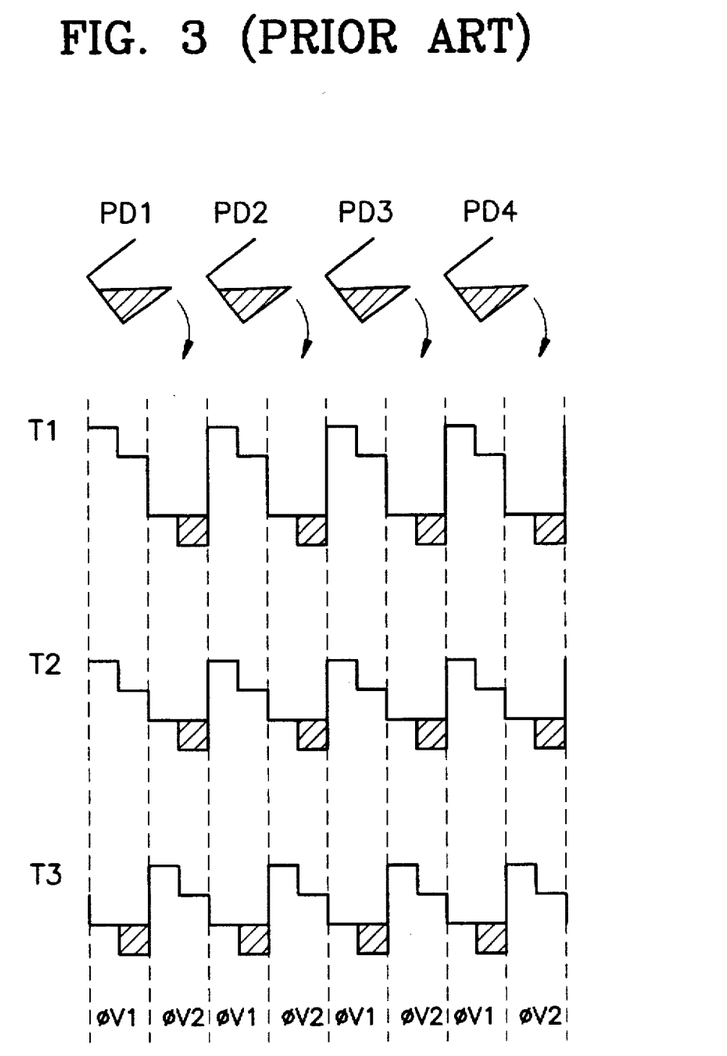
FIG. 3 is a conceptual diagram of a vertical charge transfer when the clock pulse shown in FIG. 2 is applied to the IT-CCD type solid-state image sensor of FIG. 1.

FIG. 2 is a waveform view of a clock pulse applied to the IT-CCD type solid-state image sensor shown in FIG. 1. FIG. 3 is a conceptual diagram illustrating a vertical charge transfer when the clock pulse shown in FIG. 2 is applied to the IT-CCD type solid-state image sensor of FIG. 1.

Referring to FIGS. 2 and 3, a method for transferring the charge of a conventional pixel frame read-out mode IT-CCD type solid-state image sensor which uses a two-phase CCD is described. During a period "T1", a clock pulse of 0 V is applied to the first gate electrode $\phi$V1, and a clock pulse of more than Vcc is applied to the second gate electrode $\phi$V2. Therefore, the charge accumulated in the photodiode is transferred to the vertical transfer region in the lower portion of the second (gate electrode $\phi$V2 through a transmission channel, since the potential well of the vertical transfer region in the lower portion of the second gate electrode $\phi$V2 is lowered.

When a clock pulse as that shown in FIG. 2 is applied to the first and second gate electrodes $\phi$V1 and $\phi$V2, respectively, the step-patterned potential well shown in FIG. 3 is formed in the vertical transfer region in the lower portion of the first and second gate electrodes. The charge transmitted from the photodiode is stored only in the potential barrier region (the oblique-lined region) among the vertical transfer regions in the lower portion of the second gate electrode $\phi$V2. This is because the potential well of the potential barrier region is lower than that of other regions.

During a period "T2", the potential well in the lower portion of the second gate electrode $\phi$V2 is a little higher than that during the period "T1". This is because a clock pulse of 0 V is applied to the first gate electrode $\phi$V1, and a clock pulse of Vcc is applied to the second gate electrode $\phi$V2.

During a period "T3", a clock pulse of Vcc is applied to the first gate electrode $\phi$V1 and a clock pulse of 0 V is applied to the second gate electrode $\phi$V2. Thus, the charge existing in the vertical transfer region in the lower portion of the second gate electrode is transferred to the vertical transfer region in the lower portion of the first gate electrode $\phi$V1 as shown in FIG. 3.

In the above-described conventional full pixel read-out mode IT-CCD type solid-state image sensor which uses the two-phase CCD to vertically transfer the charge, only two phase clock pulses are needed. Thus, the first and second gate electrodes may be fabricated by a two layer polysilicon process.

However, since the charge is stored only in the region corresponding to ½ the area occupied by a unit gate electrode, as shown in FIG. 3, the CCD area efficiency (the ratio of the area used in storing the normally transferred charge to the entire area) is generally only ¼(25%). Therefore, the charge transfer performance is generally lowered to half that of the four-phase CCD whose CCD area efficiency is generally ½(50%).

Figure 4:
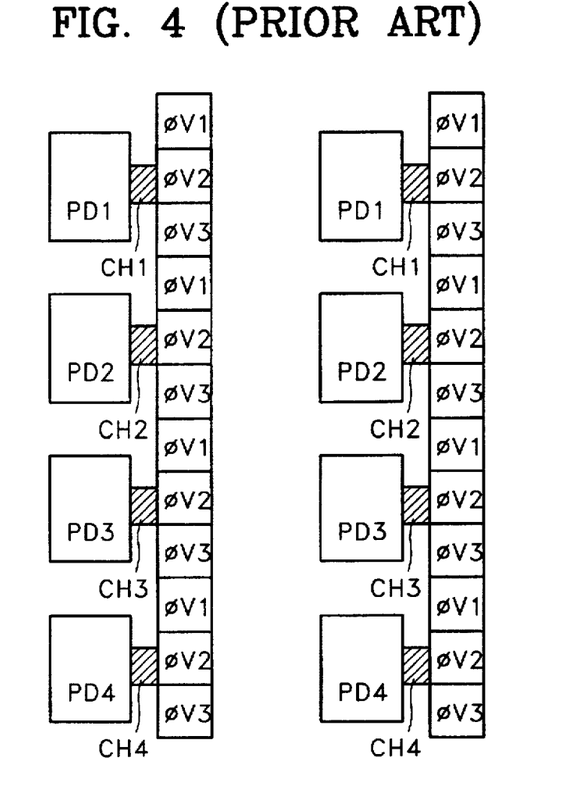
FIG. 4 is a plan view showing a pixel arrangement of a full pixel read-out IT-CCD type solid-state image sensor according to another conventional method in which a three phase CCD is used as the vertical charge transfer means.

FIG. 4 is a plan view showing a pixel arrangement of another conventional full pixel read-out mode IT-CCD type solid-state image sensor which uses a three-phase CCD as the vertical charge transfer means. In FIG. 4, in contrast with FIG. 1, three gate electrodes, i.e., first, second and third gate electrodes φV1, φV2 and φV3, are correspondingly provided for each unit photodiode PD1, PD2, PD3 or PD4.

Figure 5:
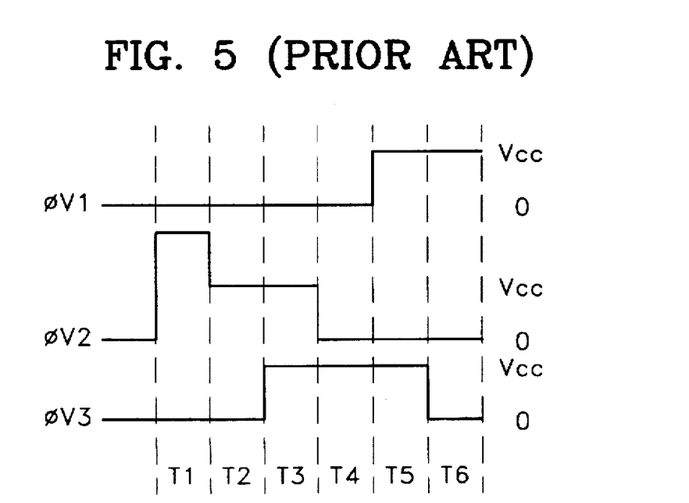
FIG. 5 is a waveform view of a clock pulse applied to the IT-CCD type solid-state image sensor shown in FIG. 4.
Figure 6:
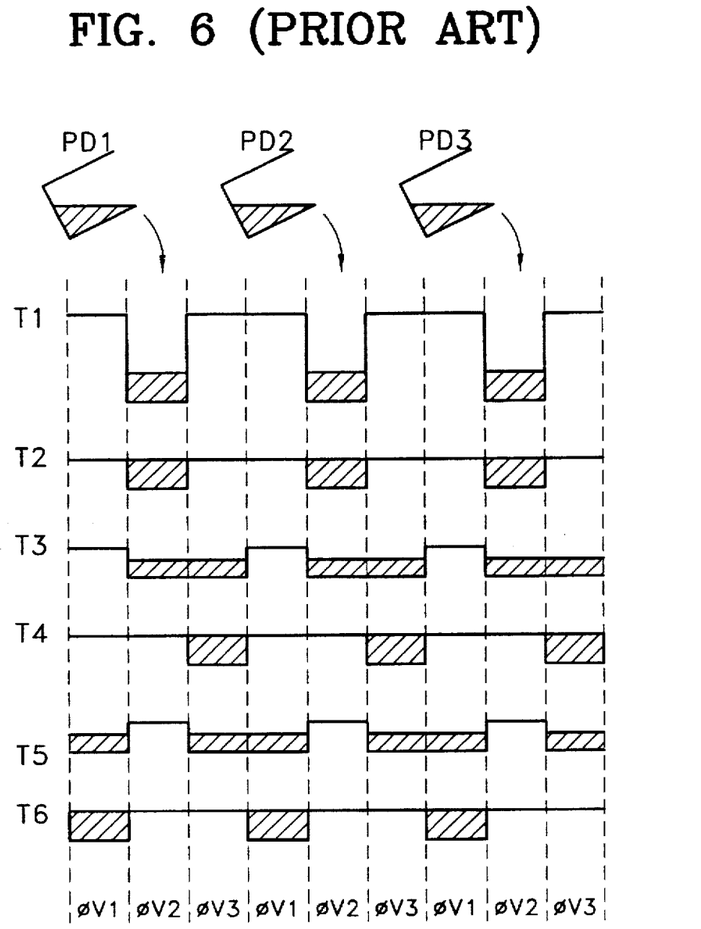
FIG. 6 is a conceptual diagram of the vertical charge transfer when the clock pulse shown in FIG. 5 is applied to the IT-CCD type solid-state image sensor of FIG. 4.

FIG. 5 is a waveform view of a clock pulse which is applied to the IT-CCD type solid-state image sensor shown in FIG. 4. FIG. 6 is a conceptual diagram of the vertical charge transfer when a clock pulse shown in FIG. 5 is applied to the IT-CCD type solid-state image sensor of FIG. 4.

Referring to FIGS. 5 and 6, the charge transmission of the conventional full pixel read-out mode IT-CCD type solid state image sensor which uses the three-phase CCD will be described. During a period "T1", a clock pulse of 0 V is applied to the first and the third gate electrodes φV1 and φV3, respectively, and a clock pulse of more than Vcc is applied to the second gate electrode φV2. Therefore, the charge accumulated in the photodiode is transferred to the vertical transfer region in the lower portion of the second gate electrode φV2 through a transmission channel, since the potential well of the vertical transfer region in the lower portion of the second gate electrode φV2 is lowered.

During a period "T2", the clock pulse applied to the second gate electrode φV2 is lowered to a Vcc. Thus, the potential well in the lower portion of the second gate electrode φV2 becomes slightly higher than that during the period of "T1".

During a period "T3", a clock pulse of Vcc is applied to the second and third gate electrodes φV2 and φV3, respectively. Thus, the charge existing in the vertical region only in the lower portion of the second gate electrode φV2 is diffused to the vertical transfer region in the lower portion of the third gate electrode φV3.

During a period "T4", a clock pulse of 0 V is applied to the first and second gate electrodes φV1 and φV2, respectively, and a clock pulse of Vcc is applied to the third gate electrode φV3. Thus, the charge existing over the vertical transfer regions in the lower portions of the second gate electrode φV2 and third gate electrode φV3 is transferred to the vertical transfer region in the lower portion of the third gate electrode φV3. Therefore, the charge existing in the vertical transfer region in the lower portion of the second gate electrode φV2 is transferred to the vertical transfer region in the lower portion of the third gate electrode φV3.

During a period "T5", a clock pulse of Vcc is applied to the first and third gate electrodes φV1 and φV3, respectively, and a clock pulse of 0 V is applied to the second gate electrode φV2. Thus, the charge existing only in the vertical transfer region in the lower portion of the third gate electrode φV3 is diffused to the vertical region in the lower portion of the adjacent first gate electrode φV1.

During a period "T6", a clock pulse of Vcc is applied to the first gate electrode φV1, and a clock pulse of 0 V is applied to the second and third gate electrodes φV2 and φV3, respectively. Thus, the charge existing over the vertical transfer regions in the lower portions of the third gate electrode φV3 and first gate electrode φV1 is transferred to the vertical transfer region in the lower portion of the adjacent first gate electrode φV1.

Thus, in the above-described conventional full pixel read-out mode CCD type solid-state image sensor which uses the three-phase CCD as means for vertically transferring the charge, a three-phase clock pulse is applied to first, second and third gate electrodes which may be fabricated in a three layer polysilicon process. However, if the size and arrangement of the photodiodes are identical to the photodiodes shown in FIG. 1, the CCD area efficiency is generally ⅓, since the area occupied by the vertical CCD is also generally identical to that of FIG. 2.

SUMMARY OF THE INVENTION

It is therefore an object of the present invention to provide charge coupled device (CCD) solid-state image sensors which can provide improved CCD area efficiency.

It is another object of the present invention to provide fabrication methods for CCD solid-state image sensors with improved efficiencies.

It is still another object of the present invention to provide driving methods for CCD image sensors of improved efficiency.

These and other objects are provided, according to the present invention by charge coupled device solid-state image sensors which comprise a substrate including a plurality of sensor groups, each sensor group consisting of N photodiodes and 2N+1 transfer electrodes, where N is at least two. By providing, for example, two photodiodes and five transfer electrodes in a group, improved area efficiency may be provided, along with efficient manufacturing and driving.

In particular, charged coupled device solid-state image sensors according to the invention comprise a substrate having a face and a plurality of photodiode groups in the substrate. Each photodiode group consists of N photodiodes arranged along the face in a predetermined direction. A plurality of transfer electrode groups is also provided on the substrate. A respective plurality of transfer electrode groups is associated with a respective one of the plurality of photodiode groups. Each transfer electrode group consists of 2N+1 transfer electrodes where N is at least two. Preferably, each of the 2N+1 transfer electrodes has the same contact area with the face. Also preferably, N is two so that two photodiodes and five transfer electrodes form a group.

According to other aspects of the invention, the transfer electrode groups are arranged along the face of the substrate in the same predetermined direction as the photodiode groups. The 2N+1 transfer electrodes in the transfer electrode groups sequentially contact the substrate face along the predetermined direction.

According to other aspects of the invention, at least one corresponding transfer electrode in each of the transfer electrode groups electrically contact each other along a second direction which is orthogonal to the predetermined direction. Moreover, at least one corresponding transfer electrode in each of the transfer electrode groups electrically contact each other along the predetermined direction. The photodiode groups and the transfer electrode groups are preferably alternatingly arranged in spaced apart relation, along a second direction which is orthogonal to the predetermined direction According to specific aspects of the invention, charged coupled device solid-state image sensors include a substrate having a face and first and second photodiodes in the substrate arranged along the face in a predetermined direction. A transfer region is also included in the substrate adjacent the first and second photodiodes and extending along the face in the predetermined direction. First through fifth transfer electrodes are located on the transfer region and are serially arranged along the face in the predetermined direction. A first transmission channel is also included in the substrate, between the first diode and the transfer region. A second transmission channel is also located in the substrate, between the second photodiode and the transfer region.

The first and third transfer electrodes are preferably portions of a first layer on the substrate. The second and fifth transfer electrodes are preferably portions of a second layer on the substrate. The fourth transfer electrode is a portion of a third layer on the substrate. Thus, a three layer fabrication process may be used to form charge coupled devices solid-state image sensors according to the invention.

The first layer and the second layer preferably extend along the face in a second direction which is orthogonal to the predetermined direction. The third layer preferably extends along the face in the predetermined direction. The first transmission channel is preferably located between the first photodiode and the second transfer electrode. The second transmission channel is preferably located between the second photodiode and the fifth transfer electrode.

Charge coupled device solid-state image sensors according to the present invention may also be fabricated efficiently by forming in a substrate face, first and second photodiodes arranged along the face in a predetermined direction and a transfer region adjacent the first and second photodiodes, extending along the face in the predetermined direction. A gate insulating layer is blanket formed on the substrate face. Three insulated patterned conductive layers are formed on the gate insulating layer, to define first through fifth transfer electrodes on the transfer region.

Specifically, the three insulated patterned conductive layers may be formed on the gate insulating layer by blanket forming a first conductive layer on the gate insulating layer. The first conductive layer is patterned to define first and third spaced apart transfer electrodes on the transfer region. A first insulating layer is formed on the first and third spaced apart transfer electrodes. A second conductive layer is blanket formed on the gate insulating layer and on the first insulating layer. The second conductive layer is patterned to define second and fifth spaced apart transfer electrodes on the transfer region which extend between the first and third spaced apart transfer electrodes and on the first insulating layer. A second insulating layer is formed on the second and fifth spaced apart transfer electrodes. A third conductive layer is blanket formed on the gate insulating layer, the first insulating layer and the second insulating layer. The third conductive layer is patterned to define a fourth transfer electrode on the transfer region, between the third and fourth transfer electrodes and on the first and second insulating layers.

The patterning steps preferably define the same size areas for the first through fifth electrodes on the gate insulating layer. The patterning steps also preferably define the second transfer electrode to be adjacent the first photodiode and the fifth transfer electrode to be adjacent the second photodiode. The patterning steps further define the first, second, third and fifth transfer electrodes to extend along the face in a second direction which is orthogonal to the predetermined direction, and define the fourth transfer electrode to extend along the face in the predetermined direction.

Charge coupled device solid-state image sensors according to the invention may be efficiently driven or operated by transferring charge from first and second photodiodes unidirectionally along a charge transfer region by applying first through fifth clock pulses to first through fifth transfer electrodes, respectively. Charge is transferred from the first photodiode to the charge transfer region by applying the second clock pulse to the second transfer electrode. Charge is transferred from the second photodiode to the charge transfer region by applying a fifth clock pulse to the fifth transfer electrode.

These operational methods may be applied to other charge coupled device solid-state image sensors wherein charge is transferred from photodiodes unidirectionally along a charge transfer region by applying a 2N+1 phase clock to 2N+1 transfer electrodes respectively, where N is at least two. Accordingly, charge coupled device solid-state image sensors may have improved area efficiency and may be fabricated and driven efficiently.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 7:
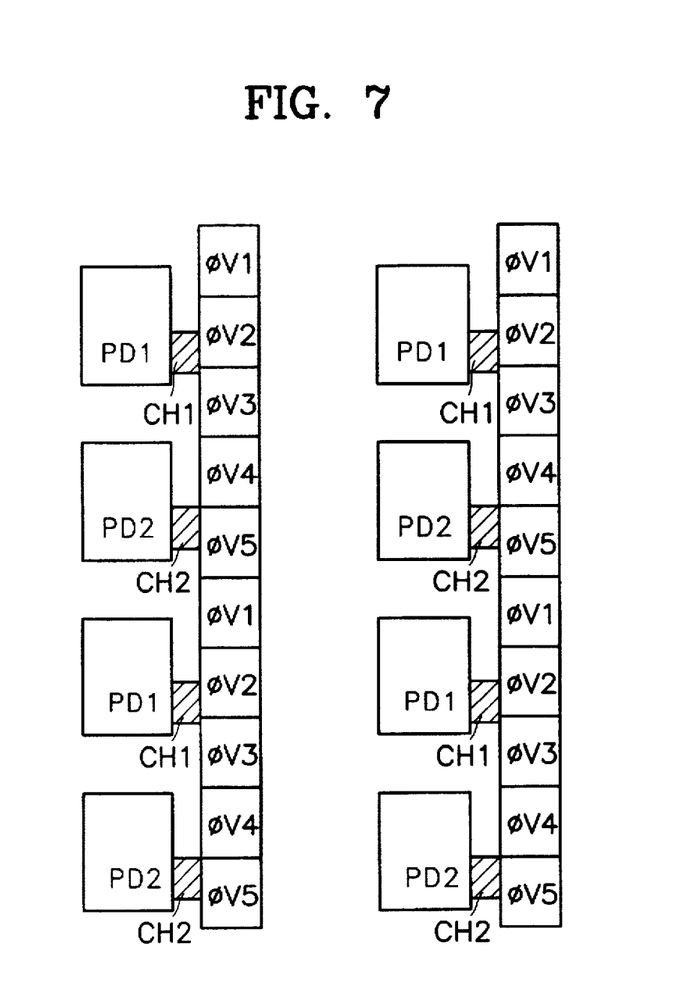
FIG. 7 is a plan view showing pixel arrangements of CCD solid-state image sensors according to the present invention.

FIG. 7 is a plan view showing pixel arrangements of CCD solid-state image sensors according to the present invention. As illustrated, a five phase CCD is used as a charge transferring means.

A first photodiode PD1 and a second photodiode PD2 are arranged to be vertically adjacent to each other, and first through fifth gate electrodes φV1 to φV5 are arranged vertically so as to correspond to the first and second photodiodes PD1 and PD2. Charge accumulated in the first photodiode PD1 is transferred to a vertical region in a lower portion of the second gate electrode φV2 through a first transmission channel CH1. Charge accumulated in the second photodiode PD2 is transferred to the vertical transfer region in the lower portion of the fifth gate electrode φV5 through a second transmission channel CH2. The charge transferred to the vertical transfer region is transmitted in a vertical direction by clock pulses applied to the first to fifth gate electrodes φV1 to φV5.

While two or three gate electrodes are arranged to correspond to every unit photodiode in FIGS. 1 and 4, five gate electrodes φV1 through φV5 are arranged to correspond to every two adjacent photodiodes PD1 and PD2, in FIG. 7. Therefore, CCD area efficiency is ⅖, which is larger than conventional efficiencies of ¼ or ⅓.

Figure 8:
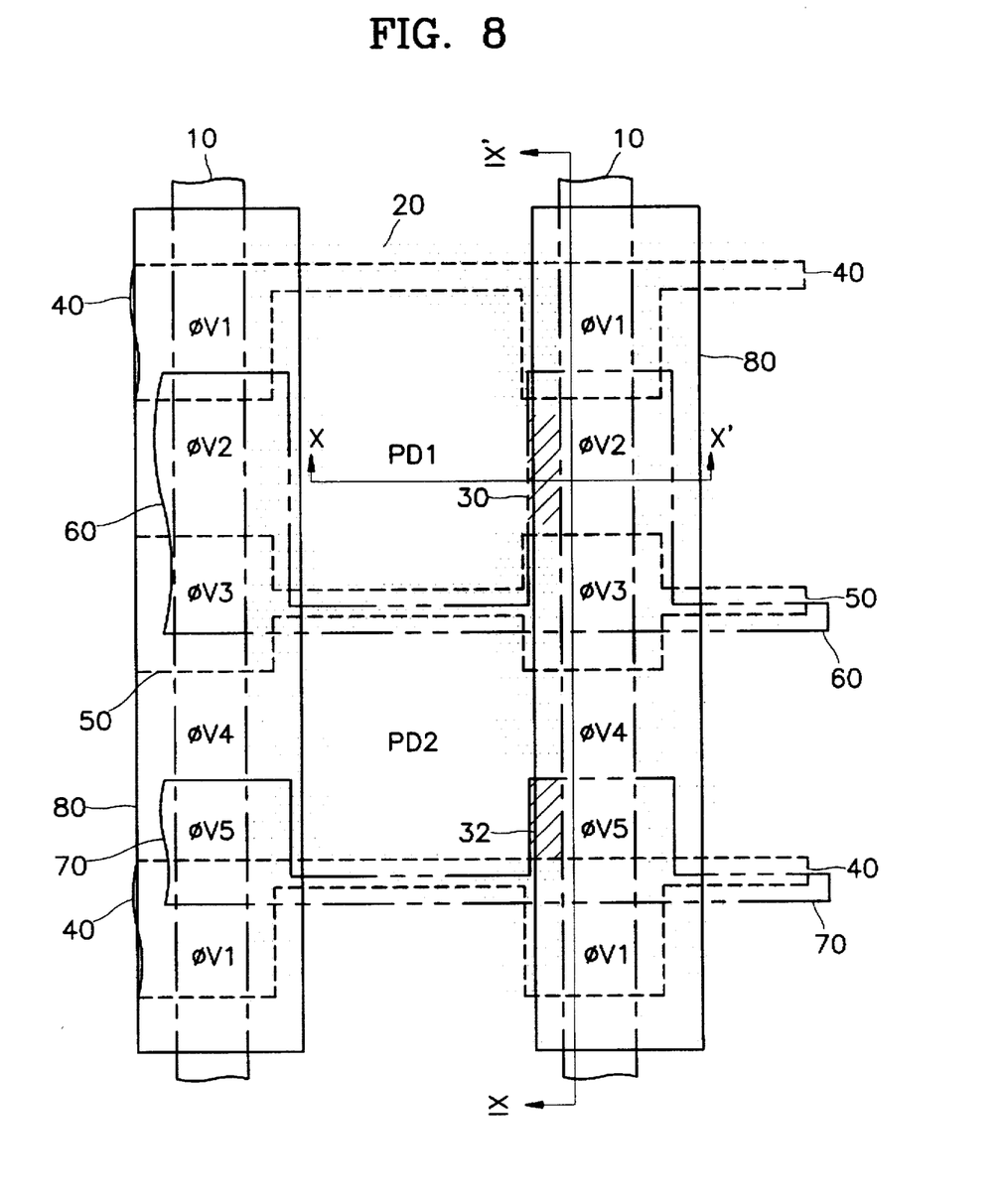
FIG. 8 is a layout diagram used for realizing CCD solid-state image sensors shown in FIG. 7.

FIG. 8 is a layout diagram which may be used for realizing CCD solid-state image sensors of FIG. 7. Reference numerals PD1 and PD2 respectively denote first and second photodiodes. Reference numerals 10, 20, 30 and 32 respectively denote a vertical transfer region of a vertical CCD (indicated by a single dashed line), a channel stop region which separates the respective photodiodes (the dotted region), and first and second transmission channels (the oblique-lined regions). Reference numerals 40, 50, 60, 70 and 80 respectively denote a mask pattern for forming a first gate electrode (indicated by a dotted line), a mask pattern for forming a third gate electrode (indicated by a dotted line), a mask pattern for forming a second gate electrode (indicated by a double dashed line), a mask pattern for forming a fifth gate electrode (indicated by a double dashed line) and a mask pattern for forming a fourth gate electrode (indicated by a solid line). Reference numerals φV1–φV5 respectively denote first to fifth gate electrodes.

The first and the second photodiodes PD1 and PD2 are arranged to be vertically adjacent each other, and the first to fifth gate electrodes φV1 to φV5 are arranged to be elongated in a vertical direction so as to correspond to the two photodiodes. The respective photodiodes are separated by the channel stop region 20.

The first photodiode PD1 is formed to transmit charge to the vertical transfer region in the lower portion of the second gate electrode φV2 by the first transmission channel 30. The second photodiode PD2 is formed to transmit charge to the vertical transfer region in the lower portion of the fifth gate electrode φV5 by the second transmission channel 32. The charge transmitted to the vertical transfer regions in the lower portions of the second and fifth gate electrodes are transferred in a vertical direction by the clock pulses applied to the respective gate electrodes.

The portions indicated by the same kind of lines, for example, solid lines, dashed lines, etc. in the mask patterns of FIG. 8, denote the same material layers. In other words, the first and third gate electrodes φV1 and φV3 indicated by the dashed lines are both formed of a first conductive layer. The second and fifth gate electrodes φV2 and φV5 indicated by the double dashed lines are formed of a second conductive layer. The fourth gate electrode φV4 indicated by the solid line is formed of a third conductive layer.

Also, the mask patterns 40, 60, 50 and 70 for forming the first, second, third and fifth gate electrodes are elongated in a horizontal direction with respect to the arrangement direction of the photodiodes. The mask pattern 80 for forming the fourth gate electrode is elongated in a vertical direction with respect to the arrangement direction of the photodiodes.

The first to fifth gate electrodes φV1 to φV5 are also designed so that the areas in which they come into contact with the semiconductor substrate are the same size as each other.

Figure 9:
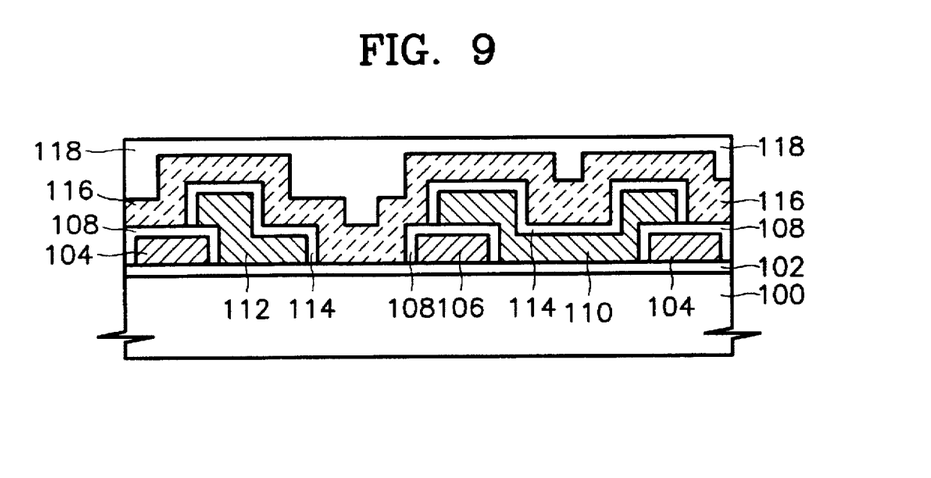
FIGS. 9 and 10 are sectional views taken along the lines IX–IX' and X–X' of FIG. 8.
Figure 10:
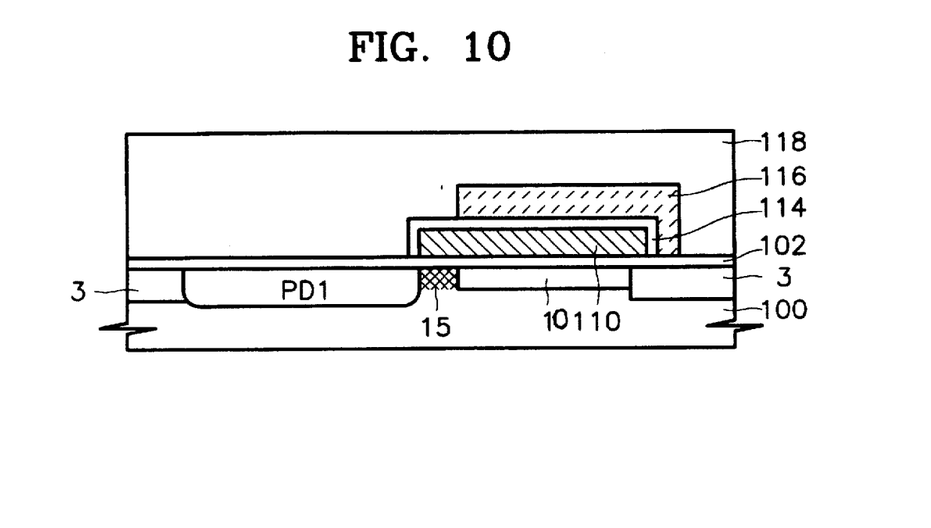

FIGS. 9 and 10 are sectional views taken along the IX–IX' and X–X' lines of FIG. 8. The first and third gate electrodes 104 and 106 are formed of a first conductive layer. The second and fifth gate electrodes 110 and 112 are formed of a second conductive layer. The fourth gate electrode 116 is formed of a third conductive layer.

Also, referring to FIG. 10, it is noted that the first photodiode PD1 can transfer charge to the vertical transfer region 10 through a first transmission channel 15 by a voltage applied to the second gate electrode 110. The respective photodiodes are electrically separated from the vertical transfer region 10 by a channel stop region 3.

Figure 11A:
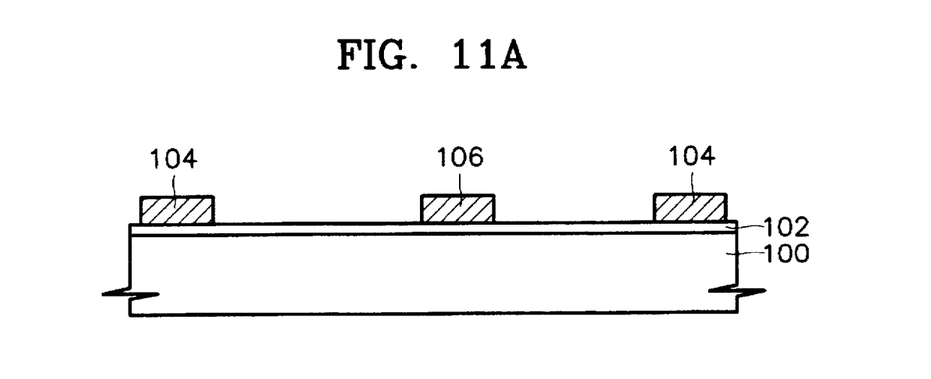
FIGS. 11A to 11C are sectional views illustrating methods for manufacturing CCD solid-state image sensors according to the present invention.
Figure 11B:
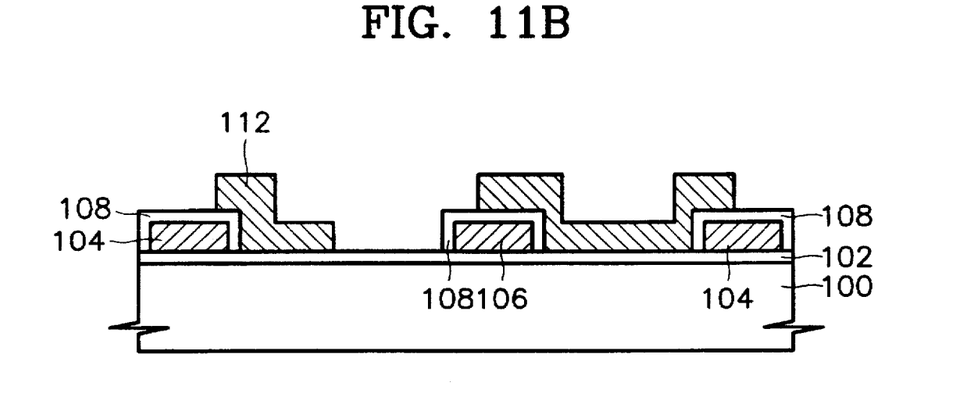
Figure 11C:
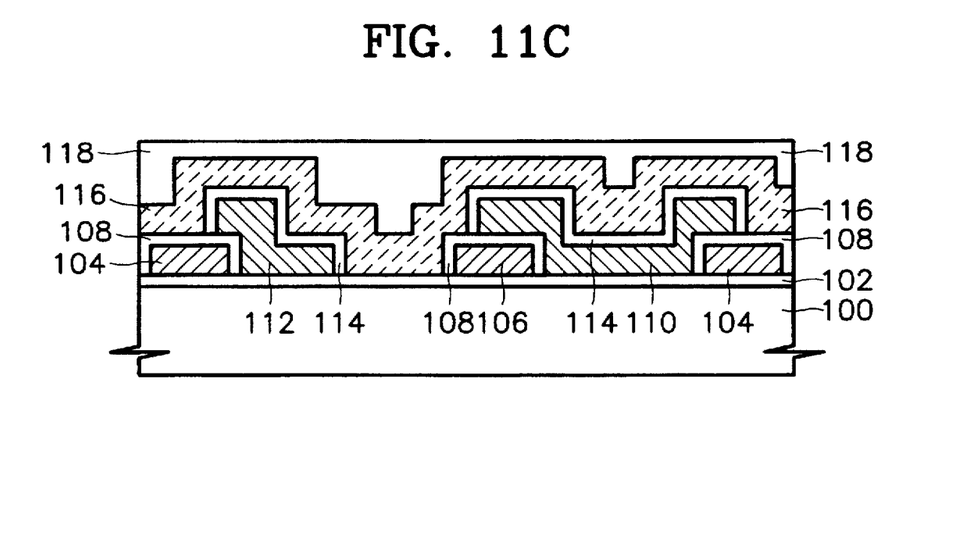

In FIGS. 9 and 10, the remaining reference numerals will be described in connection with FIGS. 11A–11C. FIGS. 11A to 11C are sectional views illustrating methods for manufacturing CCD solid-state image sensors according to the present invention.

FIG. 11A shows a process for forming the first and third gate electrodes 104 and 106, which includes the steps of: (1) blanket forming a gate insulating film 102 on the entire surface of a semiconductor substrate in which the first and second photodiodes (not shown), the vertical transfer region (not shown), the first and second transmission channels (not shown) and a channel stop region (not shown) are formed; (2) forming a first conductive layer by depositing a layer such as polysilicon; and (3) forming the first and third gate electrodes 104 and 106 by patterning the first conductive layer. The first gate electrode 104 is formed to be spaced apart from the third gate electrode 106 by a predetermined distance.

FIG. 11B shows a process for forming the second and fifth gate electrodes 110 and 112, which includes the steps of: (1) forming a first insulating layer 108 by oxidizing the surfaces of the first and third gate electrodes 104 and 106; (2) blanket forming a second conductive layer by depositing a conductive layer such as polysilicon; and (3) forming the second and fifth gate electrodes 110 and 112 by patterning the second conductive layer. The second gate electrode 110 is arranged between the first gate electrode 104 and the third gate electrode 106, and the fifth gate electrode 112 is formed to be spaced apart from the third gate electrode 106 by a predetermined distance.

FIG. 11C shows a process for forming the fourth gate electrode 116 and an insulating layer 118, which includes the steps of: (1) forming the second insulating layer 114 by oxidizing the surfaces of the second and fifth gate electrodes 110 and 112; (2) blanket forming the third conductive layer on the entire surface of the resultant substrate on which the second insulating layer 114 is formed; (3) forming the fourth gate electrode 116 by patterning the third conductive layer; and (4) blanket forming the insulating layer 118 on the fourth gate electrode 116. The fourth gate electrode 116 is formed between the third gate electrode 106 and the fifth gate electrode 112.

Also, in FIGS. 11A to 11C, the areas in which the first through fifth gate electrodes come into contact with the semiconductor substrate are the same as each other.

Figure 12:
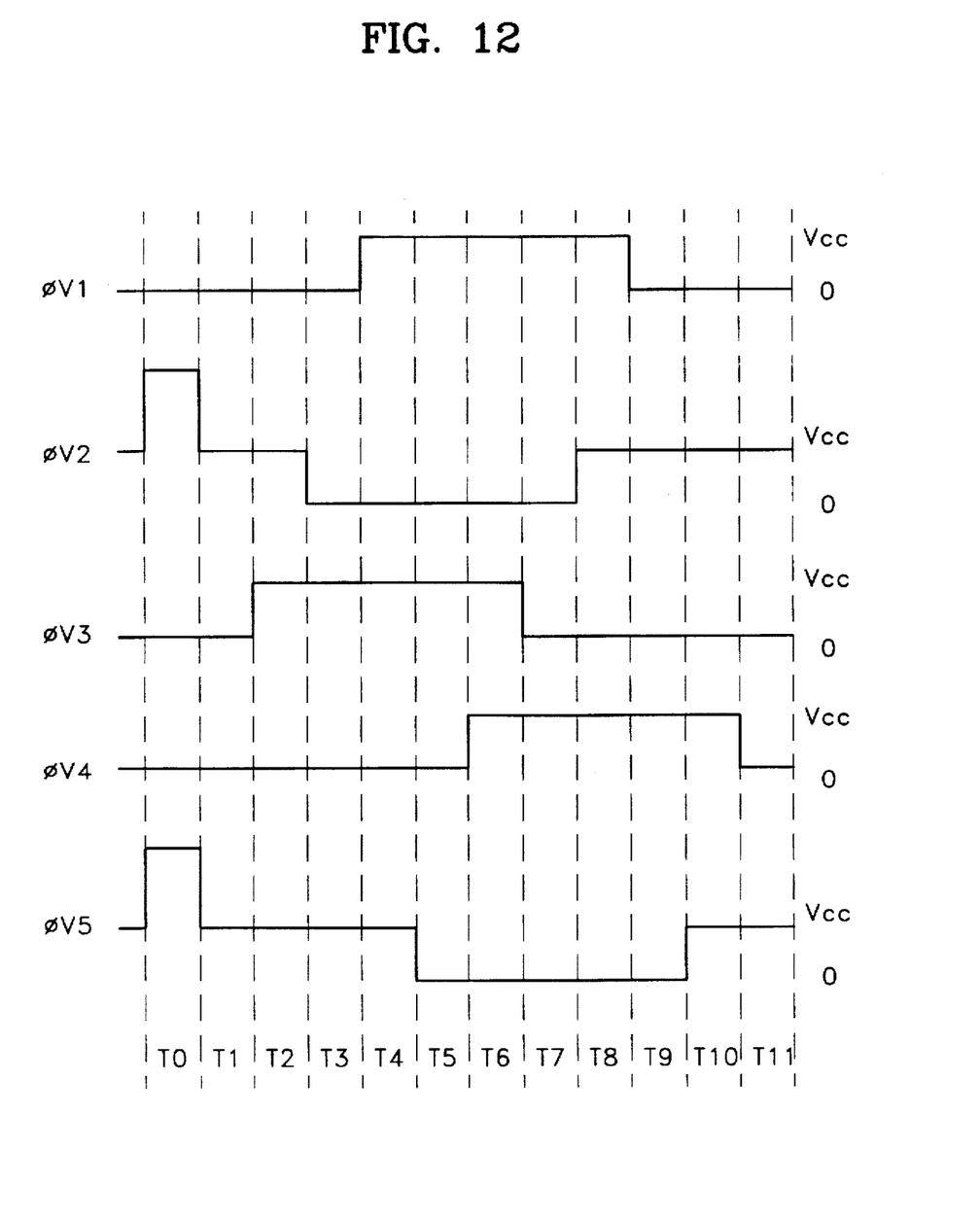
FIG. 12 is a waveform view of clock pulses applied to the CCD solid-state image sensors according to the present invention.
Figure 13:
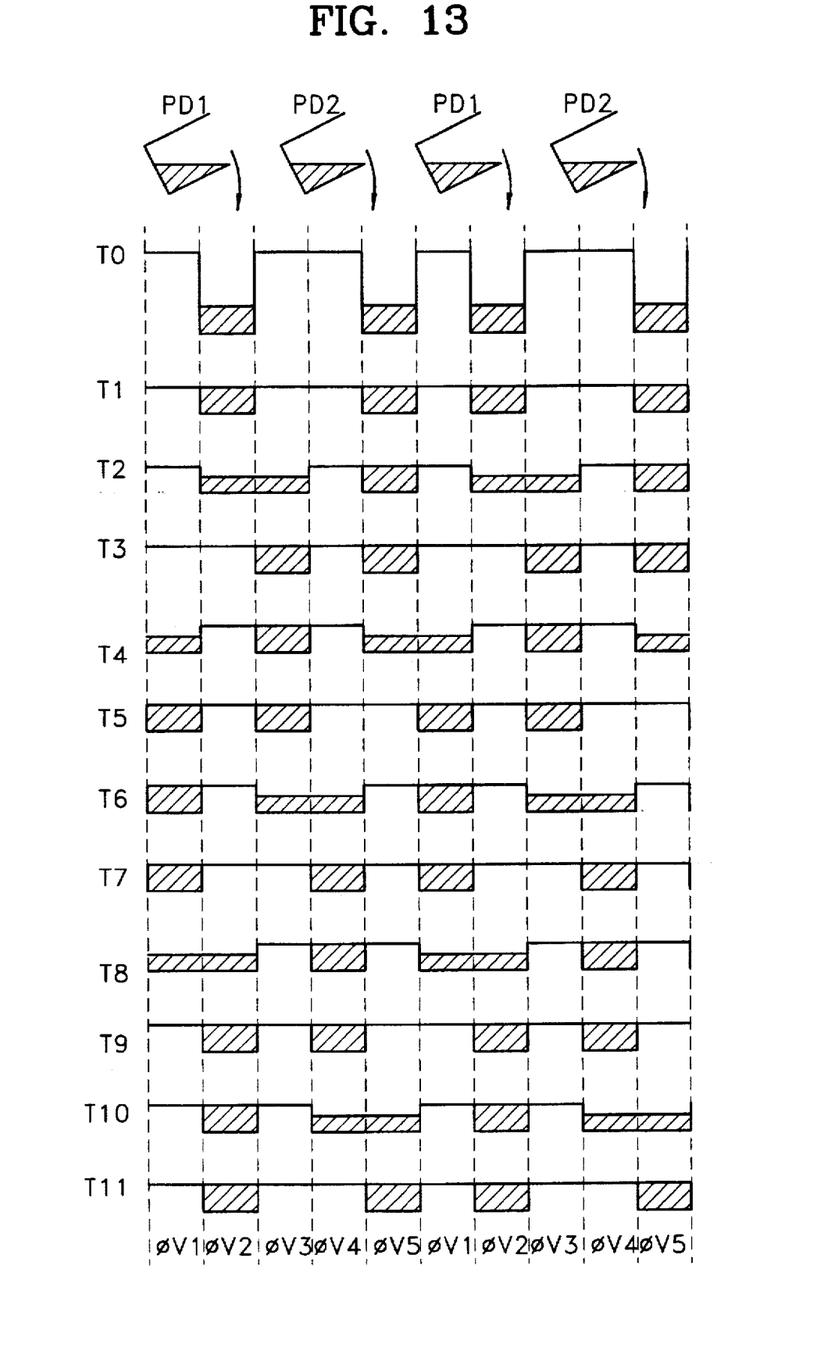
FIG. 13 is a conceptual diagram illustrating charge transmission when the clock pulses shown in FIG. 12 are applied to the CCD solid-state image sensors according to the present invention.

FIG. 12 is a waveform of clock pulses applied to CCD solid-state pixel sensors according to the present invention. FIG. 13 is a conceptual view of the vertical charge when the clock pulses shown in FIG. 12 are applied to the CCD solid-state image sensors according to the present invention. Referring to FIGS. 12 and 13, charge transferring methods of CCD solidstate image sensors according to the present invention in which a five-phase clock is used, will be described.

During a period "T0", a clock pulse of 0 V is applied to the first, third and fourth gates $\phi$V1, $\phi$V3 and $\phi$V4, respectively, and a clock pulse of more than Vcc is applied to the second and fifth gate electrodes $\phi$V2 and $\phi$V5. Therefore, the potential well of the vertical transfer region in the lower portions of the second and fifth gate electrodes $\phi$V2 and $\phi$V5 is lowered and the charge accumulated in the first and second photodiodes PD1 and PD2 is respectively transferred to the vertical transfer regions in the lower portions of the second and the fifth gate electrodes $\phi$V2 and $\phi$V5 through the first and second transmission channels CH1 and CH2.

During a period "T1", a clock pulse of 0 V is applied to the first, the third and fourth gate electrodes $\phi$V1, $\phi$V3 and $\phi$V4, and a clock pulse of Vcc is applied to the second and fifth gate electrodes $\phi$V2 and $\phi$V5. The potential well of the vertical transfer regions in the lower portions of the second and fifth gate electrodes $\phi$V2 and $\phi$V5 becomes higher than that of "T0".

During a period "T2", a clock pulse of 0 V is applied to the first and fourth gate electrodes $\phi$V1 and $\phi$V4 and a clock pulse of Vdd is applied to the second, third and fifth gate electrodes $\phi$V2, $\phi$V3, and $\phi$V5. The potential well of the vertical transfer region in the lower portion of the third gate electrode $\phi$V3 is lowered. Thus, the charge existing only in the vertical transfer region in the lower portion of the second gate electrode $\phi$V2 is diffused into the vertical region in the lower portion of the third gate electrode $\phi$V3.

During a period "T3", the clock pulse of 0 V is applied to the first, second and fourth gate electrodes $\phi$V1, $\phi$V2, and $\phi$V4, and Vcc is applied to the third and fifth gate electrodes $\phi$V3 and $\phi$V5. The potential well of the vertical transfer region in the lower portion of the second gate electrode $\phi$V2 becomes higher and that of the vertical transfer region in the lower portion of the third gate electrode $\phi$V3 is lowered. Thus, the charge existing over the vertical transfer regions in the lower portions of the second gate electrode $\phi$V2 and third gate electrode $\phi$V3 moves to the vertical transfer region in the lower portion of the third gate electrode $\phi$V3.

As a result, in the periods from "T0" to "T3", the charge existing in the vertical transfer region in the lower portion of the second gate electrode $\phi$V2 is transferred to the vertical transfer region in the lower portion of the third gate electrode $\phi$V3.

During a period "T4", a clock pulse of 0 V is applied to the second and fourth gate electrodes $\phi$V2 and $\phi$V4, and a clock pulse of Vcc is applied to the first, third and fifth gate electrodes $\phi$V1, $\phi$V3 and $\phi$V5. The potential well of the vertical transfer region in the lower portion of the first gate electrode $\phi$V1 is lowered. Thus, the charge existing in the vertical transfer region in the lower portion of the fifth gate electrode $\phi$V5 is diffused to the vertical transfer region in the lower portion of the first gate electrode $\phi$V1.

During a period "T5", a clock pulse of 0 V is applied to the second, fourth and fifth gate electrodes $\phi$V2, $\phi$V4 and $\phi$V5, respectively, and a clock pulse of Vcc is applied to the first and third gate electrodes $\phi$V1 and $\phi$V3, respectively. The potential well of the vertical transfer region in the lower portion of the fifth gate electrode $\phi$V5 becomes higher. Thus, the charge existing over the vertical transfer regions in the lower portions of the fifth gate electrode $\phi$V5 and the adjacent first gate electrode $\phi$V1 move to the vertical transfer region in the lower portion of the adjacent first gate electrode $\phi$V1.

As a result, in the periods from "T4" to "T5", the charge existing in the vertical transfer region in the lower portion of the fifth gate $\phi$V5 is transferred to the vertical transfer region in the lower portion of the adjacent first gate electrode $\phi$V1.

During a period "T6", a clock pulse of 0 V is applied to the second and fifth gate electrodes $\phi$V2 and $\phi$V5, and a clock pulse of Vcc is applied to the first, third and fourth gate electrodes $\phi$V1, $\phi$V3, and $\phi$V4. The potential well of the vertical region in the lower portion of the fourth gate electrode $\phi$V4 is lowered. Thus, the charge existing in the vertical transfer region in the lower portion of the third gate electrode $\phi$V3 are diffused to the vertical transfer region in the lower portion of the fourth gate electrode $\phi$V4.

During a period "T7", a clock pulse of 0 V is applied to the second, third and fifth gate electrodes $\phi\phi$V2, $\phi$V3 and $\phi$V5, and a clock pulse of Vcc is applied to the first and fourth gate electrodes $\phi$V1 and $\phi$V4. The potential well of the vertical transfer region in the lower portion of the third gate electrode $\phi$V3 becomes higher. Thus, the charge existing over the vertical regions in the lower portion of the third gate electrode $\phi$V3 and fourth gate electrode $\phi$V4 move to the vertical region in the lower portion of the fourth gate electrode $\phi$V4.

As a result, in the periods from "T6" to "T7", the charge existing in the vertical transfer region in the lower portion of the third gate $\phi$V3 is transferred to the vertical transfer region in the lower portion of the fourth gate electrode $\phi$V4.

During a period "T8", a clock pulse of 0 V is applied to the third and fifth gate electrodes $\phi$V3 and $\phi$V5, and a clock pulse of Vcc is applied to the first, second and fourth gate electrodes $\phi$V1, $\phi$V2 and $\phi$V4. The potential well of the vertical transfer region in the lower portion of the second gate electrode $\phi$V2 is lowered. Thus, the charge existing in the vertical transfer region in the lower portion of the first gate electrode $\phi$V1 is diffused to the vertical transfer region in the lower portion of the second gate electrode $\phi$V2.

During a period "T9", a clock pulse of 0 V is applied to the first, third and fifth gate electrodes $\phi$V1, $\phi$V3 and $\phi$V5, and a clock pulse of Vcc is applied to the second and fourth gate electrodes $\phi$V2 and $\phi$V4. The potential well of the vertical transfer region in the lower portion of the first gate electrode $\phi$V1 becomes higher. Thus, the charge existing over the vertical transfer regions in the lower portions of the first gate electrode $\phi$V1 and second gate electrode $\phi$V2 moves to the vertical transfer region in the lower portion of the second gate electrode $\phi$V2.

As a result, in the periods from "T8" to "T9", the charge existing in the vertical transfer region in the lower portion of the first gate $\phi$V1 is transferred to the vertical transfer region in the lower portion of the second gate electrode $\phi$V2.

During a period "T10", a clock pulse of 0 V is applied to the first and third gate electrodes $\phi$V1 and $\phi$V3, and a clock pulse of Vcc is applied to the second, fourth and fifth gate electrodes $\phi$V2, $\phi$V4 and $\phi$V5. The potential well of the vertical transfer region in the lower portion of the fifth gate electrode $\phi$V5 is lowered. Thus, the charge existing in the vertical transfer region in the lower portion of the fourth gate electrode φV4 is diffused to the vertical transfer region in the lower portion of the fifth gate electrode φV5.

During a period "T11", a clock pulse of 0 V is applied to the first, third and fourth gate electrodes φV1, φV3 and φV4, and a clock pulse of Vcc is applied to the second and fifth gate electrodes φV2 and φV5. The potential well of the vertical transfer region in the lower portion of the fourth gate electrode φV4 becomes higher. Thus, the charge existing over the vertical transfer regions in the lower portions of the fourth gate electrode φV4 and fifth gate electrode φV5 moves to the vertical transfer region in the lower portion of the fifth gate electrode φV5.

As a result, in the periods from "T10" to "T11", the charge existing in the vertical transfer region in the lower portion of the fourth gate φV4 is transferred to the vertical transfer region in the lower portion of the fifth gate electrode φV5.

Therefore, according to the above-mentioned driving method, the charge accumulated in the vertical transfer regions in the lower portions of the second and fifth gate electrodes are transferred by a five phase driving voltage applied to the first to fifth gate electrodes φV1 to φV5.

Structures, manufacturing methods, and driving methods of the present invention can be applied to solid-state image sensors having at least first through Nth photodiodes and first through 2N+1th gate electrodes corresponding to the photodiodes, where N is at least two. Thus, solid-state image sensors having the first and second photodiodes and the first through fifth gate electrodes corresponding to the photodiodes are the minimum size. A clock pulse of 2N+1 phases is applied to the 2N+1 gate electrodes. Therefore, solid-state image sensors and methods for manufacturing and driving the same according to the present invention, can improve charge transferring performance since CCD area efficiency of ⅔ can be obtained, using three-layer polysilicon processing.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A charge coupled device solid-state image sensor, comprising:
   a substrate having a face;
   a plurality of photodiode groups in the substrate, each photodiode group consisting of N photodiodes arranged along the face in a predetermined direction; and
   a plurality of transfer electrode groups on the substrate, a respective one of which is associated with a respective one of the plurality of photodiode groups, each transfer electrode group consisting of 2N+1 transfer electrodes, where N is at least two.

2. An image sensor according to claim 1 wherein each of the 2N+1 transfer electrodes has same contact area with the face.

3. An image sensor according to claim 1 wherein N is two.

4. An image sensor according to claim 1 wherein the 2N+1 transfer electrodes in the transfer electrode groups sequentially contact the substrate face along the predetermined direction.

5. An image sensor according to claim 1 wherein the transfer electrode groups are arranged along the face in the predetermined direction.

6. An image sensor according to claim 5 wherein at least one corresponding transfer electrode in each of the transfer electrode groups electrically contact each other along a second direction which is orthogonal to the predetermined direction.

7. An image sensor according to claim 6 wherein at least one corresponding transfer electrode in each of the transfer electrode groups electrically contact each other along the predetermined direction.

8. An image sensor according to claim 1 wherein the photodiode groups and the transfer electrode groups are alternatingly arranged in spaced apart relation along a second direction which is orthogonal to the predetermined direction.

9. A charge coupled device solid-state image sensor, comprising:
   a substrate including a plurality of sensor groups, each sensor group consisting of two photodiodes and five transfer electrodes.

10. A charge coupled device solid state image sensor, comprising:
    a substrate having a face;
    first and second photodiodes in the substrate, arranged along the face in a predetermined direction;
    a transfer region in the substrate, adjacent the first and second photodiodes and extending along the face in the predetermined direction;
    first through fifth transfer electrodes on the transfer region and serially arranged along the face in the predetermined direction;
    a first transmission channel in the substrate between the first photodiode and the transfer region; and
    a second transmission channel in the substrate between the second photodiode and the transfer region.

11. An image sensor according to claim 10:
    wherein the first and third transfer electrodes are portions of a first layer on the substrate;
    wherein the second and fifth transfer electrodes are portions of a second layer on the substrate; and
    wherein the fourth transfer electrode is a portion of a third layer on the substrate.

12. An image sensor according to claim 11:
    wherein the first layer and the second layer extend along the face in a second direction which is orthogonal to the predetermined direction; and
    wherein the third layer extends along the face in the predetermined direction.

13. An image sensor according to claim 10 wherein each of the first through fifth transfer electrodes have same contact area with the face.

14. An image sensor according to claim 10:
    wherein the first transmission channel is located between the first photodiode and the second transfer electrode; and
    wherein the second transmission channel is located between the second photodiode and the fifth transfer electrode.

* * * * *